United States Patent [19]
Bax

[11] Patent Number: 4,705,963
[45] Date of Patent: Nov. 10, 1987

[54] AC CONTROLLED DIODE SWITCH

[75] Inventor: Anton M. Bax, Forthampton, England

[73] Assignee: Smiths Industries Public Limited Company, London, England

[21] Appl. No.: 774,426

[22] Filed: Sep. 10, 1985

[30] Foreign Application Priority Data

Sep. 18, 1984 [GB] United Kingdom ................. 8423574

[51] Int. Cl.⁴ .................... H03K 17/74; H03K 17/60; H03K 5/159
[52] U.S. Cl. .................................... 307/257; 307/592; 307/570
[58] Field of Search ............... 307/257, 256, 591, 570, 307/592

[56] References Cited

U.S. PATENT DOCUMENTS

| | | | |
|---|---|---|---|
| 2,927,259 | 3/1960 | Neal | 307/591 |
| 3,148,323 | 9/1964 | Blake et al. | 307/257 |
| 3,286,158 | 11/1966 | Thatcher | 307/257 |
| 3,597,633 | 8/1971 | Kordaira-shi | 307/257 |
| 3,668,434 | 6/1972 | Brungsberg | 307/257 |

FOREIGN PATENT DOCUMENTS

| | | |
|---|---|---|
| 1174561 | 12/1969 | United Kingdom . |
| 1275749 | 5/1972 | United Kingdom . |
| 1437764 | 6/1976 | United Kingdom . |
| 1446421 | 8/1976 | United Kingdom . |
| 2113025 A | 7/1983 | United Kingdom . |
| 2153168 A | 1/1984 | United Kingdom . |
| 2152772 A | 12/1984 | United Kingdom ... 02001971/GBX |

*Primary Examiner*—Stanley D. Miller
*Assistant Examiner*—B. P. Davis
*Attorney, Agent, or Firm*—Pollock, Vande Sande & Priddy

[57] ABSTRACT

An a.c. switch has two pairs of diodes each of which has two diodes connected in back-to-back relationship between the signal input and output of the switch. The two pairs of diodes are connected in parallel with each other in opposite senses. A MOSFET transistor is connected between the junctions of the two diodes in each pair. A switching control unit controls switching of the transistor such that, when the transistor is conducting, signal current flows between the input and output via one diode in one pair, the transistor, and one diode in the other pair. When the transistor is not conducting, current flow between the input and output is blocked.

4 Claims, 2 Drawing Figures

AC CONTROLLED DIODE SWITCH

BACKGROUND OF THE INVENTION

This invention relates to switches.

When it is desired to switch an alternating current using a solid-state device, this is conventionally performed by means of triacs. Triacs, however, suffer from the disadvantage that they can be turned on, when they are supposed to be off, by a voltage spike at the supply input. This effect is known as 'commutation' and is well-known in triacs to be a disadvantage. Because, once triggered, a triac remains in a conducting state until the supply current ceases, this can lead to the undesired passage of current for a long time, with consequent possible damage to the circuit connected to the output of the triac.

Attempts are usually made to reduce this commutation effect by the use of filters to reduce the triac's exposure to fast voltage spikes or edges. By filtering in this way, however, the amount of useful power that can be passed through the triac is reduced and, because the filter involves bulky inductances and capacitors, the size and weight of the equipment is increased.

BRIEF SUMMARY OF THE INVENTION

It is an object of the present invention to provide a switch that can be used to avoid the above-mentioned disadvantages.

According to the present invention, there is provided a switch including a signal input, a signal output, a first pair of unidirectional current devices connected in back-to-back relationship in series between the input and output, a second pair of unidirectional current devices connected in back-to-back relationship in series between the input and output in the opposite sense and in parallel with said first pair, a transistor switching device connected between the two respective junctions between the unidirectional current devices of the first and second pairs such that when the transistor switching device is conducting, signal current flows between the input and output via a unidirectional current device in each of said first and second pairs and via said transistor switching device, and such that when the transistor switching device is non-conducting, signal current flow between the input and output is substantially blocked.

Because transistor switching devices can be provided, the switching of which is insensitive to large voltage excursions at the terminals of the device, commutation problems can be avoided. Also, any anomalous input at the gate (or base) of the transistor switching device will generally only cause switching of the device for the duration of the anomalous input. This thereby reduces the risk of damage caused by current flow through the transistor switching device.

The transistor switching device is preferably a MOSFET transistor and the unidirectional current devices are preferably diodes. The switch may include switching control means arranged to control switching of the transistor switching device. The switching control means may include a capacitor the charge on which controls switching of the transistor switching device. The switching control means may also include resistor means connected across the capacitor, the capacitor and resistor means being arranged such that, when the switching control means is holding the transistor switching device on, the transistor switching device is maintained on despite alternation of the signal at the input. The switching control unit preferably includes switching means that is arranged to control the charge on the capacitor, and the switching means may include a transistor which may be connected in series with the capacitor and a source of d.c. voltage.

An a.c. switch will now be described, by way of example, with reference to the accompanying drawings.

DETAILED DESCRIPTION

Figure 1:
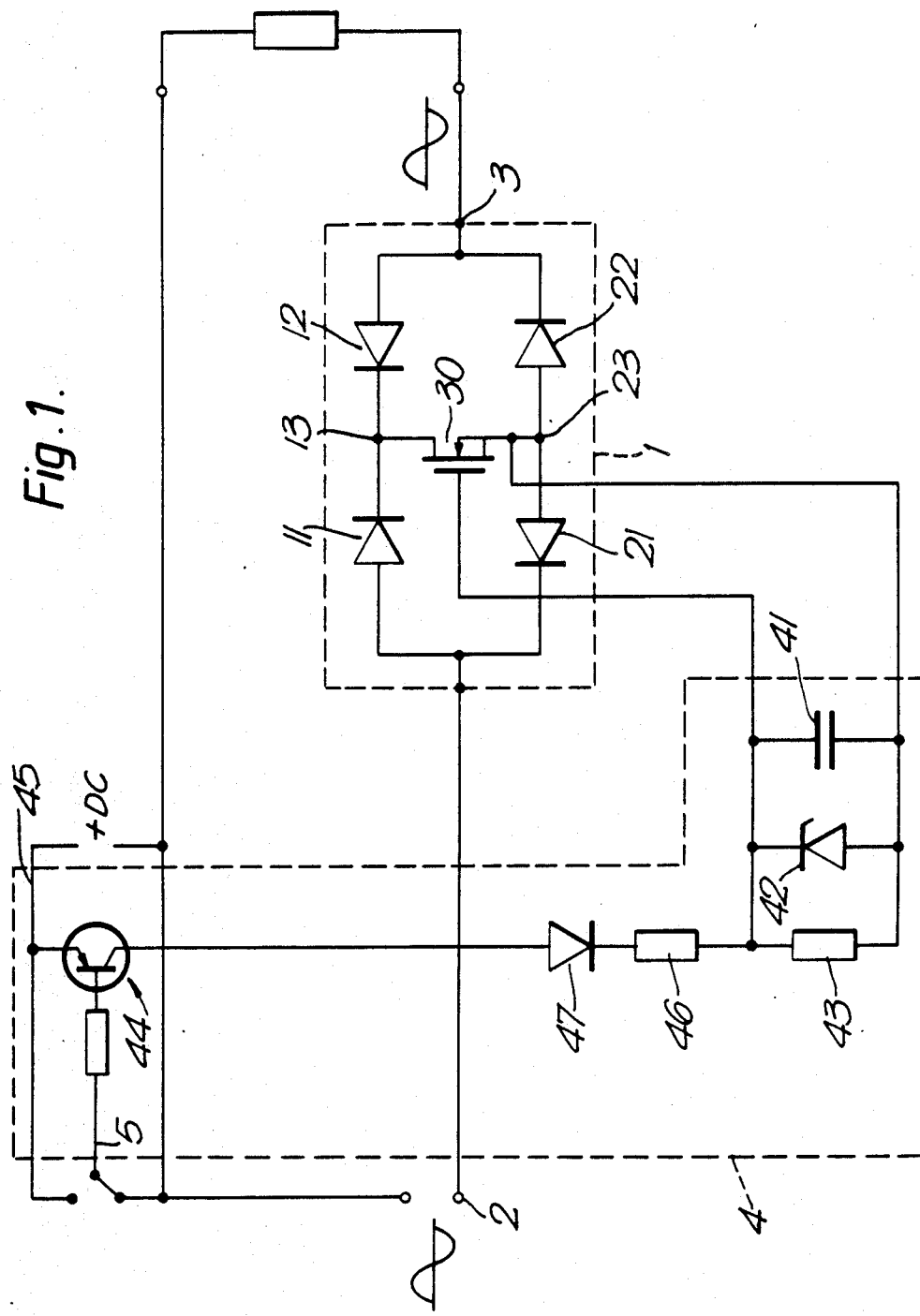
FIG. 1 shows the switch schematically.

The switch comprises a switching unit 1 connected in series between a signal input 2 and a signal output 3. Operation of the unit 1 is controlled by a switching control unit 4 which receives control signals on line 5.

The switching unit 1 includes a first pair of diodes 11 and 12, or similar unidirectional current devices, connected in back-to-back relationship in series between the input 2 and output 3. The cathodes of the two diodes are connected to a common junction 13. The switching unit 1 also includes a second pair of diodes 21 and 22 connected in back-to-back relationship in series between the input 2 and output 3. and in parallel with the first pair of diodes 11 and 12. The second second pair of diodes 21 and 22 is connected in the opposite sense to the first pair of diodes, and have their anodes connected to a common junction 23. The switching unit 1 is completed by an N-channel MOSFET transistor 30 connected with its source and drain across the junctions 13 and 23.

The transistor 30 can be switched on or off, that is, so that current flow between the junctions 13 and 23 via the transistor is enabled or prevented. When the transistor 30 is on, the switching unit 1 is rendered conductive so that signal current can flow between the input 2 and output 3. The current from the alternating input signal itself, at the input 2, flows from the input via the diode 11, the transistor 30 and the diode 22 to the output 3, during positive parts of the cycle; during negative parts of the cycle, current flows from the output 3 via the diode 12, the transistor 30 and the diode 21 to the input 2. Current flow through the transistor 30 is therefore always in the same sense.

When the transistor 30 is off, the switching unit 1 is rendered non-conductive so that current flow between the input 2 and output 3 is blocked. An alternating signal at the input 2 will be blocked by the diodes 21 during positive parts of the cycle, and by the diodes 22 and 11 during negative parts of the cycle.

Switching of the transistor 30, and hence of the switching unit 1, is accomplished by a switching control unit, one example of which is described below.

The output of the switching control unit 4 is connected across the gate and source of the transistor 30, the transistor being switched on when the gate voltage is positive. The control unit 4 includes a capacitor 41 connected across the output and in parallel with a zener diode 42 and resistor 43, the cathode of the zener diode being connected with the gate of the transistor 30. A transistor 44 is connected in series with a positive voltage line 45 and the parallel- connected resistor 43, zener diode 42 and capacitor 41, via a resistor 46 and diode 47. The base of the transistor 44 is connected to the input line 5 of the control unit 4.

In operation, a low voltage on the input line 5 causes the transistor 44 to be rendered conductive. When the signal at the input 2 goes negative, current is drawn through the transistor 44 to charge the capacitor 41. This causes the transistor 30 in the switching unit 1 to switch on. When the signal at the input 2 swings positive, this prevents any current flow through the transistor 44, but the time constant of the capacitor 41 and resistor 43 are such as to ensure that the transistor 30 in the switching unit 1 remains on.

When it is desired to render the switching unit 1 non-conductive, the input signal to the control unit 4 on line 5 is switched positive so that transistor 44 in the control unit is turned off. Any residual charge on the capacitor 41 is dissipated through resistor 43, so that the gate potential of the transistor 30 falls below a level sufficient for it to remain on, and so that the switching unit 1 is thereby turned off.

The transistor 30 is insensitive to large voltage spikes at the input terminal 2 so that it will not be switched on by such spikes in the manner that can happen in triacs. It is possible that, for example, electrical interference could cause an anomalous output from the control unit 4 which could raise the gate potential of the transistor 30 sufficiently for the switching unit to be turned on. However, conduction of the transistor 30 is dependent on the gate potential being maintained high so, as soon as it falls, the transistor will again become non-conductive.

Figure 2:
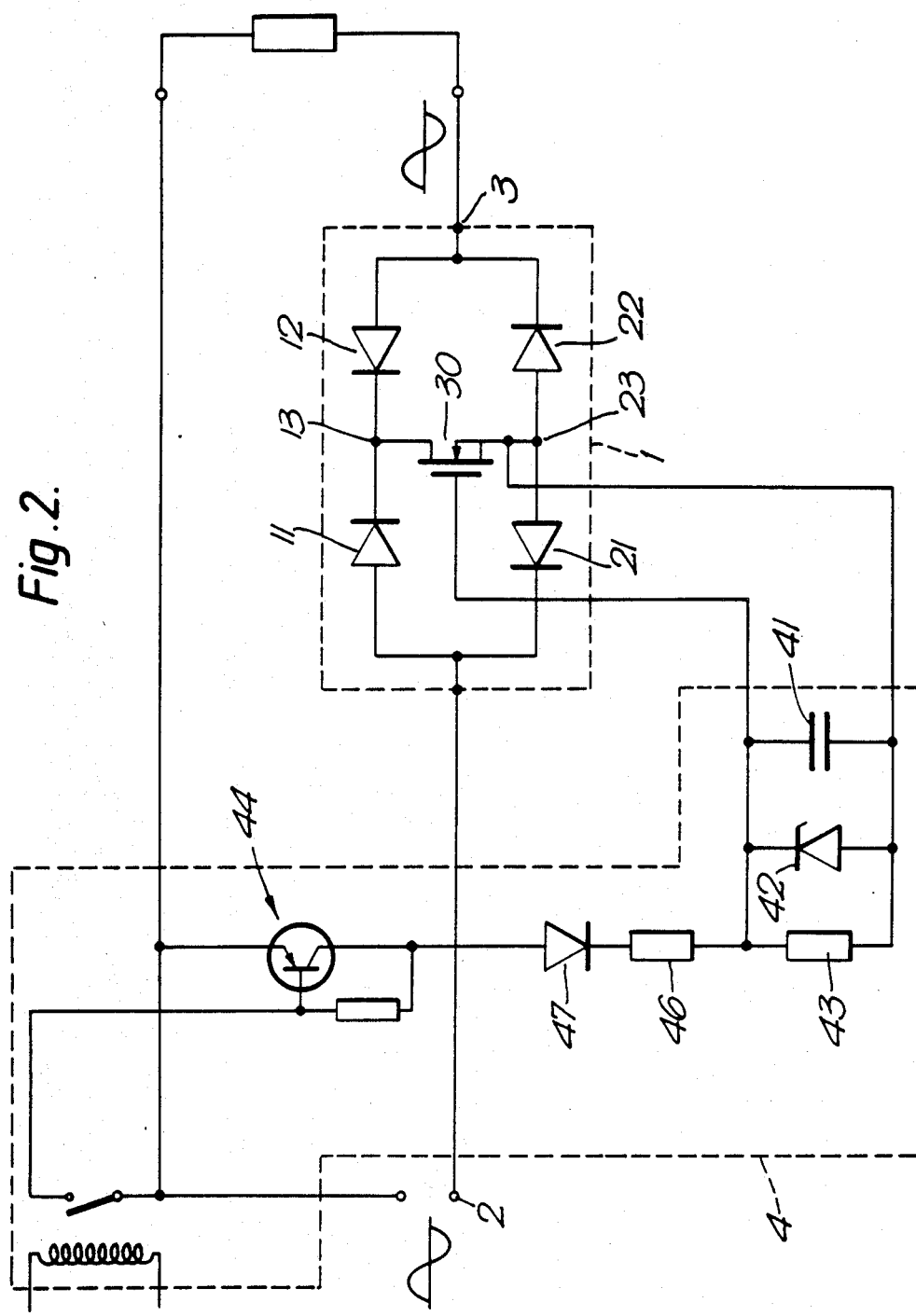
FIG. 2 shows a modification of the switch of FIG. 1.

The need for the positive d.c. rail 45 can be avoided, such as by the circuit shown in FIG. 2 in which the emitter of the transistor 44 is connected to the input 2.

Neither circuit requires any high voltage supply to bias the diodes 11,12,21 or 22 to conduct, thereby avoiding the need for any bulky high voltage circuitry. Because the input signal flows between the input 2 and output 3 via naturally conducting diodes, there is no limitation on the input voltage.

What I claim is:

1. An a.c. switch comprising: an alternating signal input; an alternating signal output; a first pair of unidirectional current devices; means connecting the unidirectional current devices of said first pair in back-to-back relationship in series between said input and the output; a second pair of unidirectional current devices; means connecting the unidirectional current devices of said second pair in back-to-back relationship in series between said input and said output in the opposite sense and in parallel with said first pair; a transistor switching device having a gate electrode; means connecting the transistor switching device between a junction between the unidirectional current devices of the said first pair and a junction between the unidirectional current devices of said second pair; a switching control circuit for selectively controlling switching of current between the said input and output for periods exceeding the period of an alternating signal at said input; means connecting said switching control circuit to control switching of said transistor switching device, said switching control circuit including a capacitor circuit comprising a capacitor and a resistor connected across said capacitor and having a time constant, a voltage source, a second switching device; and means connecting said capacitor circuit between said gate electrode of the transistor switching device and said voltage source via said second switching device, said second switching device being connected to receive an alternating signal, said second switching device being controlled by said alternating signal intermittently to pass current to charge said capacitor, the charge on said capacitor controlling switching of the transistor switching device and the time constant of said capacitor circuit being such that the transistor switching device remains conductive for periods exceeding the period of an alternating signal at the input despite switching of said second switching device caused by alternation of said alternating signal and signal current flows between said input and output via a unidirectional current device in each of said first and second pairs and via said transistor switching device, and such that when the alternating signal is not applied to said second switching device prevents charging of said capacitor means thereby causing said transistor switching device to become non-conductive and thereby substantially blocking signal current flow between the said input and output.

2. A switch according to claim 1, wherein the said transistor switching device is a MOSFET transistor.

3. A switch according to claim 1, wherein the said unidirectional current devices are diodes.

4. A switch according to claim 1, wherein the said switching means includes a transistor.

* * * * *